(12) United States Patent
Lee

(10) Patent No.: US 6,214,098 B1
(45) Date of Patent: *Apr. 10, 2001

(54) CHEMICAL-MECHANICAL POLISHING SLURRY

(75) Inventor: Kevin J. Lee, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/504,191

(22) Filed: Feb. 15, 2000

Related U.S. Application Data

(63) Continuation of application No. 09/203,432, filed on Dec. 1, 1998, now Pat. No. 6,077,337.

(51) Int. Cl.⁷ .................................................. H01L 21/461
(52) U.S. Cl. .............................. 106/3; 216/89; 438/692; 438/693; 282/79.1; 51/308
(58) Field of Search ..................... 106/3; 282/79.1; 216/89; 438/692, 693; 51/308, 307, 309

(56) References Cited

U.S. PATENT DOCUMENTS

| | | | |
|---|---|---|---|
| 2,680,756 | 6/1954 | Pauson | 260/439 |
| 4,874,222 | 10/1989 | Vacha et al. | 350/96.34 |
| 5,340,370 | 8/1994 | Cadien et al. | 51/308 |
| 5,407,526 | 4/1995 | Danielson et al. | 156/636 |
| 5,516,346 | 5/1996 | Cadien et al. | 51/308 |
| 5,604,158 | 2/1997 | Cadien et al. | 437/200 |
| 5,611,943 | 3/1997 | Cadien et al. | 216/88 |
| 5,612,254 | 3/1997 | Mu et al. | 438/634 |
| 5,625,217 | 4/1997 | Chau et al. | 257/412 |
| 5,635,423 | 6/1997 | Huang et al. | 437/195 |
| 5,637,185 | 6/1997 | Murarka et al. | 438/5 |
| 5,700,383 | 12/1997 | Feller et al. | 216/88 |
| 5,700,726 | 12/1997 | Huang et al. | 437/643 |
| 5,739,579 | 4/1998 | Chiang et al. | 257/635 |
| 5,755,614 | 5/1998 | Adams et al. | 451/60 |

OTHER PUBLICATIONS

Dub, M., "Methods of Synthesis, Physical Constants and Chemical Reactions", *Organometallic Compounds,* vol. I, Second Edition covering the Literature from 1937–1964, pp. 226–228, (1966).

Rockett, et al., *Journal of Organometallic Chemistry,* Vo. 211, pp. 215–279, (May 19, 1981).

Wilkerson, G., *The Journal of the American Chemical Society,* vol. LXXIV, 3 pages, (Jul.–Sep. 1952).

*Primary Examiner*—C. Melissa Koslow
(74) *Attorney, Agent, or Firm*—Schwegman, Lundberg, Woessner & Kluth, P.A.

(57) ABSTRACT

One embodiment of the present invention includes a chemical-mechanical polishing (CMP) slurry. The slurry is comprised of one or more ferrocenium salts that is or are reduced, during use, to ferrocene. The slurry also includes an abrasive and a concentration of hydronium ions effective to impart a pH of less than 7.

11 Claims, 3 Drawing Sheets

CHEMICAL-MECHANICAL POLISHING SLURRY

This application is a continuation of U.S. Ser. No. 09/203,432, filed Dec. 1, 1998, now U.S. Pat. No. 6,077,337.

BACKGROUND

The present invention relates to a chemical-mechanical polishing (CMP) slurry formulation that comprises an organometallic oxidizing agent and to a method for treating a metallic surface with the CMP slurry.

Manufacture of high performance solid state devices requires an extremely precise and clean completion of a series of unit operations. One series of unit operations refines surfaces created and manipulated in the manufacture of solid state devices. Surfaces created in the manufacture of solid state devices must meet rigid quality control criteria that include a minimizing of irregularities from one point on the surface to another. Irregularities are characterized by deviations in topography over the surfaces or by transient chemical reactions, such as an undesirable oxidation reaction on a surface. Polishing the surfaces having the irregularities is one operation used to remove the irregularities.

One polishing operation is a chemical-mechanical polishing (CMP). This polishing or "planarizing" operation produces a desired surface topography by simultaneous performance of chemical etching with an etchant and mechanical buffing with an abrasive.

The reference, *Microchip Fabrication*, Third Edition, by Peter van Sant (1997) generally describes the CMP operation when used to treat the surface of a silicon wafer. Specifically, Mr. van Sant described the wafers as being mounted on rotating holders and lowered onto a pad surface rotated in an opposite direction to the rotating holders. A slurry of a silica abrasive suspended in a chemical etchant such as potassium hydroxide or ammonium hydroxide is applied to the pad.

For this CMP application, the chemical etchant is typically alkaline. The alkaline pH enables a silicon wafer to form a silicone dioxide passivating layer once planarization by the etchant and silica slurry is completed. Buffing action of the pad mechanically removes the oxide continuously. This process is continued until the surface topography of each wafer is absolutely flat.

The CMP operation is the only method available for providing global planarization of an entire silicon wafer. The challenge for manufacturers utilizing the CMP operation is to employ a slurry that does not contaminate the wafer surface, that balances chemical removal from the wafer surface with abrasive aggressiveness, and that polishes the wafer at an acceptable production rate while producing a planar surface.

The CMP operation is also usable in the manufacture of an integrated circuit or a circuit section such as a metallized layer that is supported by a silicon wafer. Complex integrated circuits include multi-level metallized layers or patterns. These metallized layers are part of a dense circuit design, with a variable topography, and a material mix. This type of dense design is enhanced by planarization of the metallic components which allows precise imaging on the layers by photolithography and which reduces thinning.

One type of metallized layer is an intermetallic dielectric layer, ILD, that is comprised of an oxide, polyimide or silicon nitride. The ILD layer is etched by photomasking techniques to define circuit elements such as contact holes, and in particular, such as vias or plugs. A thin adhesion layer such as titanium nitride, TiN, is formed over the ILD and into the via hole. A conformal tungsten film is blanket deposited over the adhesion layer. The vias or plugs are also filled with tungsten. A CMP slurry and planarization method can be used in a planarization process to polish back the blanket deposited tungsten film in order to form plugs or vias within the silicon wafer.

The Cadien et al. patents, U.S. Pat. No. 5,516,346, issuing May 14, 1996, and U.S. Pat. No. 5,340,370, issuing Aug. 23, 1994, describe CMP slurries for thin films used in integrated circuit manufacturing. One embodiment of the CMP slurries described includes an oxidizing agent, potassium ferricyanide, and an abrasive such as silica. This CMP slurry is acidic and is described as having a pH within a range of 2 to 4. This CMP slurry has been used in polishing back a blanket deposited tungsten film to form plugs or vias.

The reference of Luo et al., *Proc. Second International UMIC Specialty Conf on CMP*, (1997) at 83, described CMP slurries for use with copper. These slurries included, as oxidizing agents, ferric nitrate and ammonium persulfate.

The Cadien et al. patent, U.S. Pat. No. 5,604,158, issuing Feb. 18, 1997, described a method of filling an opening in an insulating layer of an integrated circuit. The method includes a step of depositing a tungsten-silicide layer over the opening. Next, a tungsten layer is deposited onto the tungsten-silicide layer so that the opening is filled with tungsten. The tungsten and tungsten-silicide layers are then chemically-mechanically polished back until the insulating layer is revealed.

Monitoring the course of CMP polishing is performed by relating time of exposure of the planarized element to the CMP slurry to previous performance records for the same process circumstances. Monitoring may also be performed by assaying chemical or physical variables of the CMP slurry that are subject to change during planarization.

The Murarka et al. patent, U.S. Pat. No. 5,637,185, issuing Jun. 10, 1997, describes a system for performing chemical-mechanical planarization on a semiconductor wafer. The system includes a CMP polishing operation. The system also includes a device for measuring electrochemical potential during the CMP polishing operation.

SUMMARY OF THE INVENTION

One embodiment of the present invention comprises a chemical-mechanical polishing (CMP) slurry. The slurry is comprised of one or more ferrocenium salts that is or are reduced, during use, to ferrocene. The slurry also includes an abrasive and a concentration of hydronium ion effective to impart to the slurry a pH that is less than 7.

Another embodiment of the present invention includes a method for planarizing a metallic surface. The method includes providing a slurry having a pH that is less than 7 and that is comprised of one or more ferrocenium salts. The slurry also includes an abrasive. The metallic surface is exposed to the slurry for a time effective to planarize the surface.

One other embodiment of the present invention includes a method for forming an opening in an interlayer dielectric. The method includes providing an ILD that defines a via hole. A layer that comprises titanium is deposited over the ILD. A layer that comprises tungsten is deposited over the titanium comprising layer so that the tungsten fills the via hole. The tungsten layer is polished with a slurry that comprises a ferrocinium salt and an abrasive.

DESCRIPTION OF THE DRAWINGS

FIG. 1b illustrates a cross-sectional view showing prior art adhesions layers and a tungsten layer on the substrate of FIG. 1a.

DETAILED DESCRIPTION OF PREFERRED EMBODIMENTS

Figure 1A:
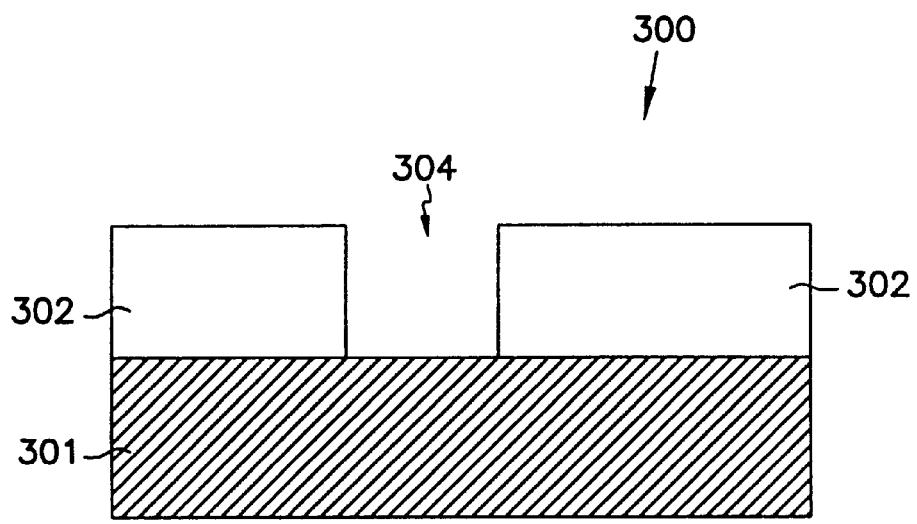
FIG. 1a illustrates a cross-sectional view of a prior art substrate portion showing a via hole through an interlayer dielectric formed on a conductive layer of a semiconductor substrate.

A chemical-mechanical polishing (CMP) slurry of the present invention is comprised of one or more ferrocenium salts $[\eta^5\text{-}(C_5H_5)_2Fe]^+$, that are reduced to ferrocene as is shown below, during surface polishing. The CMP slurry also includes an abrasive dispersed in water. The CMP slurry of the present invention has a pH that is less than 7 and, in one embodiment, falls within a range of 3 to 6.

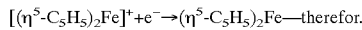
$[(\eta^5\text{-}C_5H_5)_2Fe]^+ + e^- \rightarrow (\eta^5\text{-}C_5H_5)_2Fe$—therefor.

One prior art chemical constituent of CMP slurries is potassium ferricyanide. Potassium ferricyanide has been found to perform as a good oxidizing agent, especially in polishing tungsten and copper. However, potassium ferricyanide is believed to be responsible for free cyanide observed in CMP slurries that comprise potassium ferricyanide because of the cyanide ligands of the ferricyanide group. Because a release of free cyanide from the CMP slurry is a potential safety hazard, an alternate oxidizing agent which does not generate a hazardous cyanide byproduct is desirable.

Because of the cyanide byproduct generation, spent CMP slurries containing potassium ferricyanide are heated to about 500° C. to decompose any cyanide evolved. The spent slurries are then burned to oxidize any remaining cyanide. The decomposition step adds significant cost to solid state device manufacturing.

A use of one or more ferrocenium salts as one of the CMP oxidizing agents eliminates a need for these additional waste treatment process procedures because the ferrocenium salts do not produce cyanide or any other known hazardous byproduct. Instead, the ferrocenium salts reduce to ferrocene, which is a highly stable, soluble organic iron compound. Ferrocene is soluble in dilute nitric acid and in 96% sulfuric acid.

Ferrocene forms a deep red hue with a strong blue fluorescence when viewed in thick layers. Ferrocene forms a blue color when viewed in very thin layers, in 96% sulfuric acid. These color changes may be useful in providing a signal that ferrocene is present in the slurry. The color change may permit a rapid qualitative assessment of ferrocene concentration or a quantitative determination of concentration of ferrocene through an analytical method such as a titrametric technique.

The ferrocinium cation, $[\eta^5\text{-}(C_5H_5)_2Fe]^+$, is readily formed from ferrocene upon oxidation and supervenes when attempts are made to carry out substitution reactions on ferrocene with agents such as $NO_2^+$ and $Br^+$. Ferrocinium cation formation also requires a presence of a solvent in the presence of an anion, ferric chloride, excess halogen, or nitric acid.

The reduction potential of ferrocinium salts to ferrocene is +0.400 volts versus a Standard Hydrogen electrode. This potential compares to +0.358 volts for the reduction of potassium ferricyanide. As discussed, the potassium ferricyanide has been found to give good polishing results for materials such as tungsten. Because of a similar redox potential, it is believed that the ferrocinium salts also display good polishing results for tungsten. Further, the ferrocinium salts utilized in the method of the present invention do not readily precipitate out of solution, or cause corrosion. The ferrocenium salts include chlorides, sulfates, perchlorates, nitrates and so on. While the slurry of the present invention is described for use in planarizing tungsten, it is understood that the CMP slurry may also be used in other applications such as the formation of interconnections, and in the planarization of layers comprising other materials such as titanium.

A slurry comprising about 0.1 molar ferrocinium salt $[\eta^5\text{-}(C_5H_5)_2Fe]^+$ provides a sufficient amount of oxidizing agent and yet is a concentration small enough to minimize cost. One range of concentration for the ferrocinium salt for use in planarizing layers and forming interconnections is 0.2 to 1.0 molar. A CMP slurry of the present invention may have a concentration of ferrocinium ion as large as 3.0 molar, if required. The large increase in concentration increases polishing cost and may reduce the predictability of outcome of the polishing process because of the possibility of increased aggressiveness. In one embodiment, a CMP slurry of the present invention is diluted in order to prevent consequences such as plug recessing.

Any water soluble ferrocinium salt is believed to be acceptable for use in the CMP slurry of the present invention. The selection of a particular ferrocinium salt is based principally upon cost and availability of the salt. One acceptable ferrocinium salt is made by mixing ferrocene with concentrated sulfuric acid to make a ferrocenium sulfate salt that has a pH within a range of 2 to 4. The CMP slurry may comprise a mixture of two or more ferrocinium salts that function as oxidants. All of the ferrocinium salts have a comparable redox potential.

The pH of a CMP slurry of the present invention is within a range low enough to prevent via or plug recessing but high enough so that the slurry is nonhazardous. A pH range of 2 to 4 provides a good balance between plug recessing and hazards handling costs.

An abrasive such as silica, alumina or ceria or a mixture of these materials is included as an ingredient to the CMP slurry to physically or mechanically strip the passivated surface of the metal or silicon being polished. Silica particles can be used without scratching the surface of the material being polished.

A CMP slurry of the present invention, when used on tungsten components, includes a colloidal silica component that comprises between 1 and 25% by weight silica. One CMP slurry has a colloidal silica concentration of about 5% by weight. This amount of silica provides an optimum balance between polish removal rate and good selectivity when used with an interlayer dielectrics system in an integrated circuit manufacturing. Additionally, this quantity of silica is sufficient to abrasively "buff" or polish the tungsten film, while reducing slurry costs.

One colloidal silica is manufactured by Cabot, Inc., and is sold under the trade name Cab-O-Sperse®. This colloidal silica comprises about 15% weight percent silica with the remainder being deionized water. The silica slurry employed has a pH that is less than 7.

In one embodiment, the CMP slurry of the present invention also includes a buffering system, such as a system comprising citric acid and potassium citrate. With this buffering system, the citric acid acts as a chelant as well as a buffer system component.

A buffering system without a chelating agent such as citric acid is also a component of one CMP slurry of the present invention. One embodiment of this type of buffering system includes as a buffering system, acetic acid and potassium citrate. This type of buffering system may also include potassium acetate. Potassium acetate serves to stabilize the pH of the slurry. Potassium acetate also acts as a lubricant for the abrasive particles. The concentrations of buffering ingredients are high enough so that the buffering system maintains an acceptable pH range and low enough so that the ingredients can be used economically. In the case of potassium acetate, the concentration range is about 0.05 to 0.005 molar.

A slurry composition for chemical-mechanical polishing of tungsten films is a solution comprising about 0.1 molar ferrocinium salt, about 5% by weight silica particles, a small amount of buffer with the remainder of the slurry comprising deionized water. In one embodiment, a small amount of concentrated acetic acid is used to adjust the pH of the tungsten slurry to a range of 3.4 to 3.6.

The slurry of the present invention, when used on tungsten and silicon films, is prepared by diluting Cabo-Sperse™ colloidal silica with deionized water until it is about 10% silica by weight. The diluted Cabo-Sperse™ colloidal silica is then mixed at a 1:1 ratio with the ferrocinium salt. The pH adjustment can then be made with acetic acid.

The CMP slurry of the present invention is believed to exhibit a good polish removal rate of about 1600 to 2400 Angstroms/min., which provides good wafer throughput. The actual rate per run is dependent upon factors such as pad types, polish pressures, rotation rates and so on.

The CMP slurry of the present invention is usable in the formation of openings or via holes in an interlayer dielectric, such as is illustrated at 300 in FIG. 1a. The method of formation of the openings or via holes, such as is illustrated at 304 in FIG. 1a, includes forming a photo resist layer over an ILD which is masked, exposed and developed to define a hole location. An insulating layer 302 is anisotropically etched to form the via hole 304. The via hole 304 is etched until a conductive layer 301 is reached.

Figure 1B:
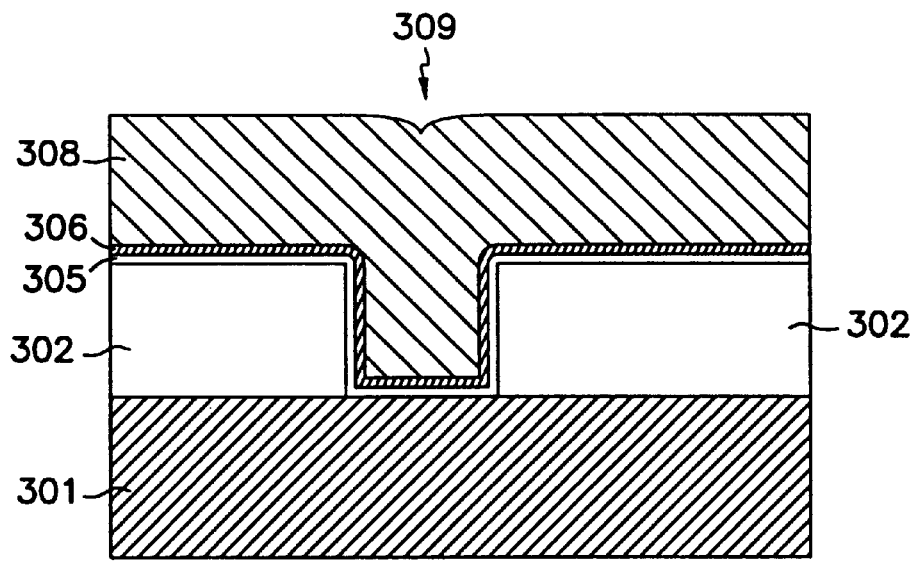

An adhesion layer 305, shown in FIG. 1b, such as titanium, is then deposited over the ILD. A titanium nitride layer 306 is deposited over the titanium layer 305. The titanium nitride layer 306 provides an adhesion layer and a diffusion barrier for the next layer, a tungsten layer. Tungsten is blanket deposited over the titanium nitride 306 to form a tungsten layer 308 and completely fills the via hole 304.

Figure 1C:
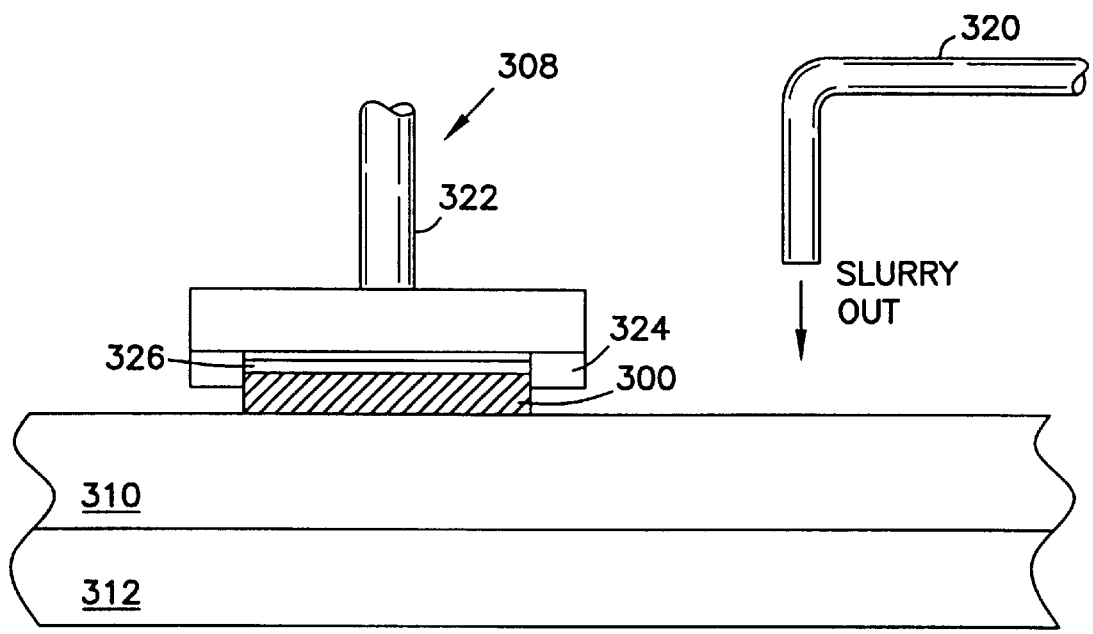
FIG. 1c illustrates a cross-sectional view of a prior art chemical-mechanical polishing apparatus which can be used to chemically mechanically polish films formed on the substrate of FIG. 1b.

The tungsten layer 308 and the titanium nitride layer 306 are polished with a CMP slurry of the present invention to form metallized plugs. In a typical CMP process, the substrate 300 is placed face down on a polishing pad 310, shown in FIG. 1c, attached to a rotatable table 312. The tungsten thin film 308 to be polished is then placed in direct contact with the polishing pad 310. A carrier 316 is used to forcibly press the substrate 300 down against the polishing pad 310.

A CMP slurry of the present invention is deposited onto the polishing pad 310 from a nozzle 320. The CMP slurry chemically oxidizes the thin film being polished and then abrasively removes or polishes off the oxidized surface. The removal of the thin film is facilitated by the chemically reactive slurry as the pad 310 and substrate 300 are rotated relative to one another under a polishing force applied by the carrier 316. Polishing is continued in this manner until the desired planarization is achieved or the desired amount of film is removed.

The polishing pad 310 may be a hard pad such as the IC-60 pad, manufactured by the Rodel Corporation or may be a soft pad such as the Polytech Supreme pad, manufactured by the Rodel Corporation. The pad must uniformly deliver slurry over the entire wafer/pad interface. In one embodiment, the slurry is pumped through the pad to the wafer-pad interface.

The chemical mechanical polishing of the tungsten layer 308 is continued until all of the tungsten layer formed on the titanium nitride layer 306 formed over the top surface of the interlayer dielectric is removed. The titanium nitride layer 306 is then chemically mechanically polished with a CMP slurry of the present invention.

Figure 1D:
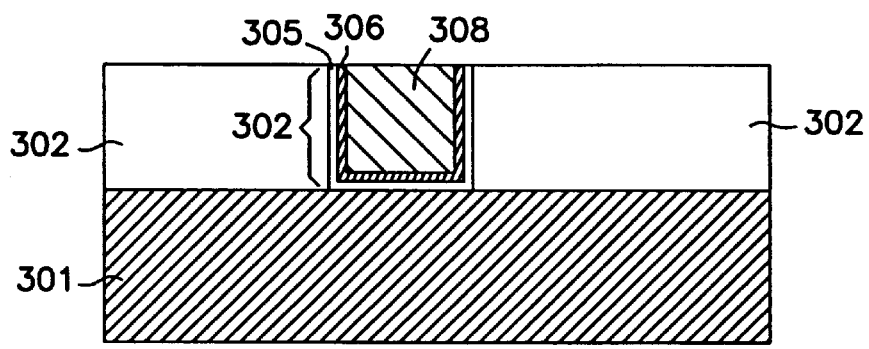
FIG. 1d illustrates a cross-sectional view of a prior art tungsten plug formed after chemically-mechanically polishing the substrate of FIG. 1b.

The CMP slurry embodiments of the present invention do not significantly polish titanium. Thus, the titanium layer 305 acts as a barrier to prevent further polishing. The titanium layer 305 is removable with a slurry that includes fluoride. One acceptable prior art slurry comprises a fluoride salt, an abrasive and has a pH that is less than or equal to 8. The fluoride salt is either sodium fluoride or potassium fluoride. The abrasive is one or more of silica, alumina or ceria. This slurry may be used with the CMP slurry embodiments of the present invention in order to planarize multiple, diverse layers. Once the CMP operation is completed, a tungsten plug such as is shown at 322 in FIG. 1d is formed.

A CMP slurry of the present invention is usable to fill in holes other than vias or contacts and is usable for polishing metals other than tungsten, tungsten silicide or titanium nitride. For instance, the CMP slurry of the present invention may be useable in planarizing interconnections such as tungsten interconnections formed in a damascene process.

Damascene generally involves a formation of a trench which is filled with a metal. In semiconductor circuit fabrication, an interconnection is made by making a trench and filling the trench with a material such as aluminum, tungsten, copper, or alloys of these materials and then planarizing the interconnection. With a dual damascene process, vias and trenches are simultaneously filled with conductive materials such as aluminum, tungsten, copper and alloys.

Figure 2:
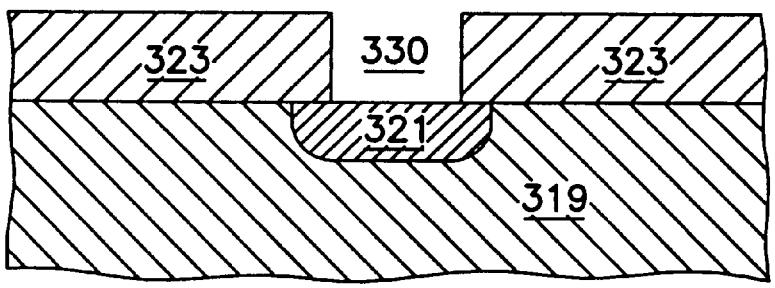
FIG. 2 illustrates a cross-sectional view of one prior art embodiment of a semiconductor substrate having a diffusion region and a dielectric layer after the dielectric layer has been patterned to define a contact opening.

In one dual damascene process, a semiconductor substrate is provided as is shown at 319 in FIG. 2 in cross-section. The semiconductor substrate 319 has a diffusion region 321. A patterned dielectric layer 323 is formed over the semiconductor substrate to define a contact opening 330. The dielectric layer 323 may include a material such as silicon dioxide, silicon nitride, silicon oxynitride, phosphosilicate glass, borosilicate glass, fluoropolymer, parylene, and polyimide.

Figure 3:
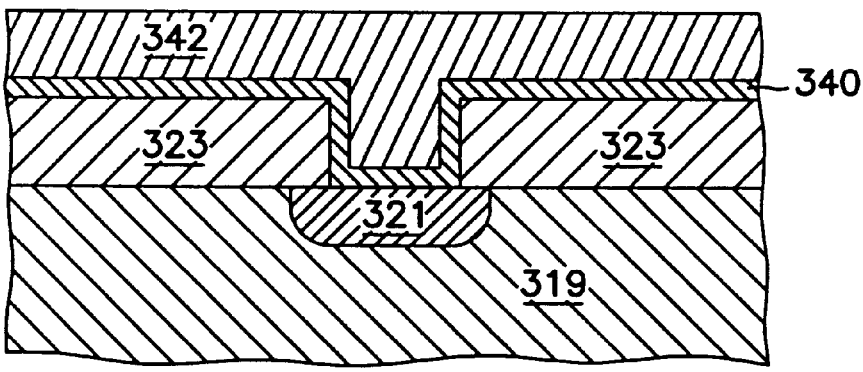
FIG. 3 illustrates a cross-sectional view of the prior art semiconductor substrate of FIG. 2 after a conductive layer has been formed over the substrate to fill the contact opening.

The contact opening is filled with a suitable conductive material or materials as is illustrated in FIG. 3. The contact opening 330 is, in one embodiment, filled with a barrier layer 340 and a conductive layer 342. The barrier layer 340 serves a diffusion barrier layer, preventing the conductive layer 342 from diffusing into diffusion region 321 or into the dielectric layer 323.

The barrier layer 340 is first formed over the substrate, covering the sidewalls and bottom in the contact opening 330. The barrier layer 340 may include any suitable conductive material such as titanium nitride, tungsten, tantalum titanium tungsten, tantalum silicon nitride, tungsten nitride, niobium or molybdenum. The conductive layer 342 is formed over the substrate, substantially filling contact opening 330. The conductive layer 342 may include any suitable conductive layer, including copper, tungsten, gold or silver.

For one embodiment, the barrier layer 340 includes titanium. The conductive layer 342 includes tungsten. Titanium serves as the diffusion barrier for tungsten, preventing the tungsten from diffusing into diffusion region 321 or dielectric layer 323. The contact opening is substantially filled with a contact plug that includes titanium and tungsten.

Figure 4:
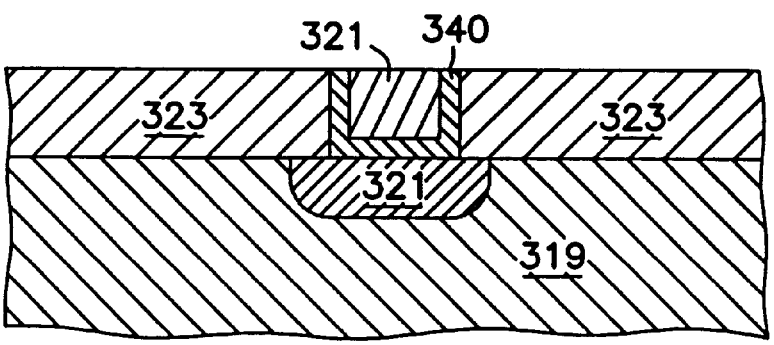
FIG. 4 illustrates a cross-sectional view of the prior art semiconductor substrate of FIG. 3 after the conductive layer overlying the dielectric layer has been removed.

The barrier layer 340 and the conductive layer 342 are then planarized to the surface of the substrate, that is until portions of the barrier surface 340 and the conductive surface 342 have been removed from the top surface of the dielectric layer 323, as illustrated in FIG. 4. The planarization is performed with the CMP slurry of the present invention. The contact opening 330 remains filled with a contact plug, including barrier layer 340 and conductive layer 342.

The CMP technique of the present invention removes the barrier layer 340 and the conductive layer 342 from the surface of the dielectric layer 323, leaving a substantially planar surface over the substrate suitable for forming higher level interconnect layers, for example. The dielectric layer 323 may serve as a polish stop in removing the barrier layer 340 and the conductive layer 342 with a CMP technique.

It is to be appreciated that the slurries of the present invention have been described in particular detail with respect to preferred processes and structures. The preferred compositions of the slurries are ideally suited for the described processes. The present invention, however, is not intended to be limited to these preferred slurry compositions. One skilled in the art will readily recognize that the actual composition of the slurries may be adjusted to accommodate particular process conditions. The scope of the slurry of the present invention is intended to be defined by the claims which follow.

What is claimed is:

1. A slurry for chemically mechanically polishing a surface, comprising:

a mixture of two or more ferrocinium salts that are reducible to ferrocene;

an abrasive; and hydronium ions in a concentration that imparts to the slurry a pH less than 7.

2. The slurry of claim 1 and further comprising ferrocene.

3. The slurry of claim 1 and further comprising a buffer.

4. The slurry of claim 1 wherein the abrasive comprises silica.

5. The slurry of claim 1 and further comprising water.

6. The slurry of claim 1 wherein the pH is within a range of 3 to 4.

7. The slurry of claim 1 wherein the ferrocinium salt is present in a concentration within a range of about 0.2 to 3.0 molar.

8. The slurry of claim 3 wherein the buffer comprises one or more of citric acid, acetic acid and potassium citrate.

9. The slurry of claim 1 and further comprising a chelating agent.

10. The slurry of claim 9 wherein the chelating agent comprises citric acid.

11. The slurry of claim 1 wherein the abrasive particles comprise about 5% by weight of the slurry.

\* \* \* \* \*